(12) United States Patent
Cheng et al.

(10) Patent No.: US 11,070,179 B2
(45) Date of Patent: Jul. 20, 2021

(54) APPARATUS AND METHOD FOR MEASURING SPEAKER TRANSDUCER IMPEDANCE VERSUS FREQUENCY WITH ULTRALOW INAUDIBLE SIGNAL

(71) Applicant: Cirrus Logic International Semiconductor Ltd., Edinburgh (GB)

(72) Inventors: Frank Cheng, Austin, TX (US); Ruoxin Jiang, Austin, TX (US); Zhong You, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/562,116

(22) Filed: Sep. 5, 2019

(65) Prior Publication Data

US 2021/0075384 A1   Mar. 11, 2021

(51) Int. Cl.
| | |
|---|---|
| *H03F 1/24* | (2006.01) |
| *H03F 1/56* | (2006.01) |
| *H03F 3/181* | (2006.01) |
| *H03F 3/217* | (2006.01) |
| *H03M 1/24* | (2006.01) |

(52) U.S. Cl.
CPC ............. *H03F 3/2175* (2013.01); *H03F 1/56* (2013.01); *H03F 3/181* (2013.01); *H03M 1/245* (2013.01); *H03F 2200/03* (2013.01); *H03F 2200/393* (2013.01); *H03F 2200/421* (2013.01); *H03F 2200/462* (2013.01)

(58) Field of Classification Search
CPC .......... H03F 3/2175; H03F 3/181; H03F 1/56; H03F 2200/421; H03F 2200/462; H03F 2200/393; H03F 2200/03; H03M 1/245

USPC ..................................... 330/10, 251, 207 A
See application file for complete search history.

(56) References Cited

U.S. PATENT DOCUMENTS

| | | | |
|---|---|---|---|
| 9,237,406 B2 * | 1/2016 | Guanziroli | ........... H04R 29/001 |
| 9,941,847 B2 * | 4/2018 | Berkhout | ............. H04R 29/001 |
| 10,877,087 B1 * | 12/2020 | Joharapurkar | ......... G01R 31/50 |
| 2014/0003616 A1 | 1/2014 | Johnson et al. | |
| 2017/0350923 A1 * | 12/2017 | Mostert | .............. G01R 31/2825 |

FOREIGN PATENT DOCUMENTS

| | | |
|---|---|---|
| EP | 2905974 A1 | 8/2015 |
| WO | WO2012004348 A1 | 1/2012 |
| WO | WO2015038257 A2 | 3/2015 |

\* cited by examiner

*Primary Examiner* — Hieu P Nguyen
(74) *Attorney, Agent, or Firm* — E. Alan Davis; James W. Huffman

(57) ABSTRACT

An apparatus measures a speaker impedance. A DAC converts a known digital input signal to an audio frequency first analog voltage signal. Resistors with known resistance attenuate the first analog voltage signal to generate a current. The known resistance effectively determines the current because the known resistance is high relative to the speaker impedance. The current is sourced into the speaker to generate a second analog voltage signal. The known resistance is sufficiently high to cause the second analog voltage signal to be inaudible as transduced by the speaker. An amplifier amplifies the second analog voltage signal with a known gain to generate a third analog voltage signal. An ADC converts the third analog voltage signal to a digital output signal. A processing element calculates the impedance of the speaker proportional to the digital output signal based on the known digital input signal, the known resistance, and the known gain.

25 Claims, 9 Drawing Sheets

APPARATUS AND METHOD FOR MEASURING SPEAKER TRANSDUCER IMPEDANCE VERSUS FREQUENCY WITH ULTRALOW INAUDIBLE SIGNAL

BACKGROUND

Electronic devices are ubiquitous today. Many of them are audio-capable, i.e., they include a speaker that transduces electrical signals into audible sound, e.g., music, speech, alarms, ringtones. Examples of such devices are mobile telephones, mobile audio devices, smart watches, tablets, laptops, etc. Typically, the speaker has a nominal impedance. For example, many speakers in electronic devices have an 8 Ohm impedance. However, the impedance of a speaker may vary, being affected by various factors, and it may be useful to know the impedance has changed.

SUMMARY

Embodiments are described herein of an apparatus and method for measuring the impedance of a speaker transducer in a manner that is inaudible to the user of the device. This may be advantageous because it enables the measurement to be performed in an interleaved fashion with intervals in which the speaker is transducing normal audio, e.g., music, speech, without the measurement being detectable by the user of the audio device.

In one embodiment, the present disclosure provides a method for measuring an impedance of a speaker. The method includes converting a known digital input signal to a first analog voltage signal in an audio frequency band and attenuating the first analog voltage signal using a known resistance to generate a current. The known resistance is high relative to the speaker impedance so that the known resistance effectively determines the current. The method also includes sourcing the current into the speaker to generate a second analog voltage signal. The known resistance is sufficiently high to cause the second analog voltage signal to be inaudible as transduced by the speaker. The method also includes amplifying the second analog voltage signal with a known gain to generate a third analog voltage signal, converting the third analog voltage signal to a digital output signal, and calculating the impedance of the speaker proportional to the digital output signal based on the known digital input signal, the known resistance, and the known gain.

In another embodiment, the present disclosure provides an apparatus for measuring an impedance of a speaker that includes a digital-to-analog converter (ADC) that converts a known digital input signal to a first analog voltage signal in an audio frequency band and resistors having a known resistance that attenuate the first analog voltage signal to generate a current. The known resistance is high relative to the speaker impedance so that the known resistance effectively determines the current. The apparatus is operable to generate a second analog voltage signal when the current is sourced into the speaker, wherein the known resistance is sufficiently high to cause the second analog voltage signal to be inaudible as transduced by the speaker. The apparatus also includes an amplifier that amplifies the second analog voltage signal with a known gain to generate a third analog voltage signal, an analog-to-digital converter (ADC) that converts the third analog voltage signal to a digital output signal, and a processing element that calculates the impedance of the speaker proportional to the digital output signal based on the known digital input signal, the known resistance, and the known gain.

DETAILED DESCRIPTION

Figure 1:
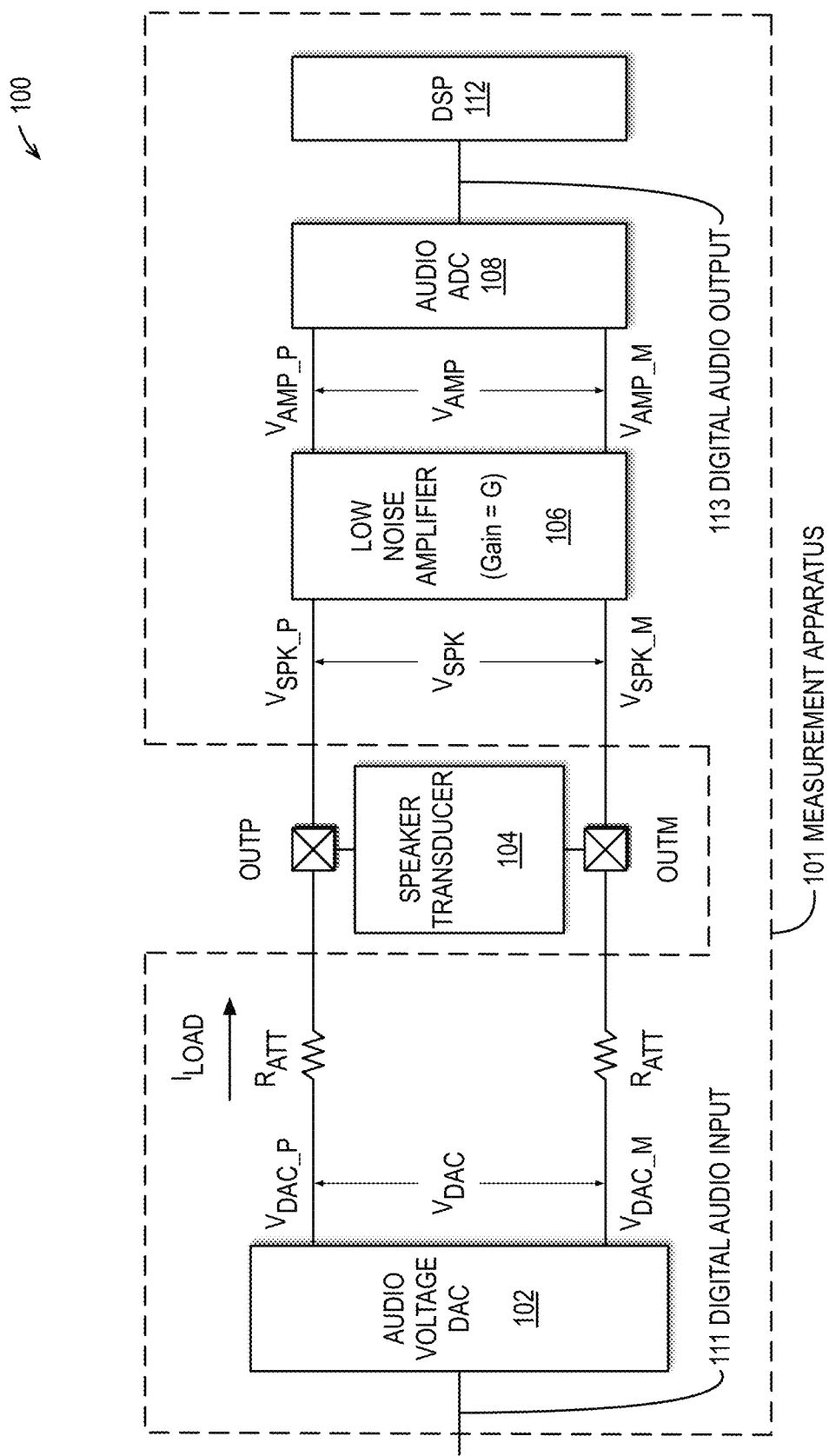
FIG. 1 is an example of a system that includes an apparatus for measuring a speaker transducer impedance as a function of frequency using an ultra-low inaudible signal in accordance with embodiments of the present disclosure.

FIG. 1 is an example of a system 100 that includes an apparatus 101 for measuring a speaker transducer impedance as a function of frequency using an ultra-low inaudible signal in accordance with embodiments of the present disclosure. The system 100 includes an audio voltage digital-to-analog converter (DAC) 102, a pair of attenuating resistors $R_{ATT}$, a speaker transducer 104, a low noise amplifier 106, and audio analog-to-digital converter (ADC) 108, and a digital signal processor (DSP) 112. The DAC 102 receives and converts a digital audio input signal 111 into a differential analog voltage $V_{DAC}$ as respective positive and negative voltage signals $V_{DAC\_P}$ and $V_{DAC\_M}$. In one embodiment, the digital audio input signal 111 is a digital pulse width modulated (PWM) signal. In one embodiment, the digital input signal 111 is generated by a class-D amplifier. The voltage $V_{DAC}$ is attenuated by attenuating resistors $R_{ATT}$. One attenuating resistor $R_{ATT}$ is connected between the positive output of DAC 102 and a positive pin OUTP, and the other attenuating resistor $R_{ATT}$ is connected between the negative output of DAC 102 and a negative pin OUTM. The terminals of the speaker 104 are connected to pins OUTP and OUTM. Thus, the speaker 104 is connected in series with the attenuating resistors $R_{ATT}$. The presence of voltage $V_{DAC}$ causes a load current $I_{LOAD}$ to flow through the attenuating resistors $R_{ATT}$ and the speaker 104. In one embodiment, an integrated circuit includes the DAC 102, attenuating resistors $R_{ATT}$, amplifier 106, and ADC 108, and the speaker 104 is external to the integrated circuit and connected to the integrated circuit via pins OUTP and OUTM of the integrated circuit. The integrated circuit may be included in an audio device, such as a telephone of FIG. 9 or headset of FIG. 10 or other audio devices. Furthermore, devices other than mobile phones and headsets may employ embodiments of the measuring apparatus 101 described herein, such as an audio watch device or other device whose speaker impedance needs to be measured in an inaudible fashion. The integrated circuit may include playback audio circuitry, such as a speaker driver (not shown), that drives the speaker 104 to playback music or other audio. The integrated circuit may include circuitry that enables the speaker driver to be selectively connected to or disconnected from the speaker 104 (e.g., when playback is desired) and that enables the measuring apparatus 101 to be selectively connected to or disconnected from the speaker 104 (e.g., when measurement of the impedance of the speaker 104 is desired). For example, in one embodiment, the speaker driver and measuring apparatus 101 include tri-state circuitry for connecting to the speaker 104, and the tri-state circuitry is placed into a high impedance state when it is desired to disconnect the speaker driver or measuring apparatus 101 from the speaker 104. For another example, the integrated circuit may include switches or other multiplexing circuitry for performing the selective connection and disconnection.

The speaker 104 may be modeled as a resistive-inductive-capacitive (RLC) circuit whose impedance varies as a function of the frequency of the load current $I_{LOAD}$. The impedance of the speaker 104 as a function of frequency may approximate a normal curve having a maximum value at a resonant frequency of the speaker 104. In some cases, an approximately 50 dB of dynamic range may exist between the highest and lowest values of the impedance for different frequencies. It is desired to accurately measure the impedance of the speaker 104 as a function of frequency. In addition to the frequency of the load current $I_{LOAD}$, environmental conditions may also affect the impedance of the speaker 104. The curve may flatten in the presence of certain environmental conditions, e.g., the presence of water, with the amount of water present affecting the amount of flattening, i.e., reducing the impedance, e.g., temperature change, with an increase in temperature generally increasing the impedance. However, the effect on the impedance of the speaker 104 by environmental conditions may be relatively slight. Thus, the ability of the measuring apparatus 101 to measure the impedance changes with high accuracy as described herein may be advantageous.

The value of the attenuating resistors $R_{ATT}$ is chosen to be large relative to the impedance of the speaker 104 so that the amplitude of the load current $I_{LOAD}$ effectively linearly scales with the digital input signal 111 regardless of the impedance of the speaker 104. That is, the amplitude of the load current $I_{LOAD}$ is effectively the ratio of the voltage $V_{DAC}$ and twice the resistance of the attenuating resistors $R_{ATT}$ since the resistance of the attenuating resistors $R_{ATT}$ is so much larger than the impedance of the speaker 104. In one embodiment, the attenuating resistors $R_{ATT}$ are approximately three orders of magnitude greater than the speaker 104 impedance. Furthermore, given that the load current $I_{LOAD}$ is constant for a given value of the digital input signal 111, the voltage $V_{SPK}$ across the speaker 104 is a linear function of the impedance of the speaker 104 for a given frequency. Thus, measuring the speaker voltage $V_{SPK}$ in response to a known value of the digital input signal 111 enables calculation of the impedance of the speaker 104. However, it may be desirable that the speaker 104 not produce audible sound during the measurement of its impedance even though the frequency of the load current $I_{LOAD}$ is in the audible range. Therefore, the value of the attenuating resistors $R_{ATT}$ is chosen large enough to cause the speaker voltage $V_{SPK}$ to be inaudible when transduced by the speaker 104. As a non-limiting example, in one embodiment the impedance of the speaker 104 under normal operating conditions of the system 100 is between approximately two and 32 Ohm (e.g., typically nominally 8 Ohm), and each of the attenuating resistors $R_{ATT}$ is a 6 kilo-Ohm resistor. As a non-limiting example, in one embodiment the amplitude of voltage $V_{DAC}$ is in the 50 milli-Volt range, and the amplitude of the speaker voltage $V_{SPK}$ is in the 50 micro-Volt range.

It is desirable to obtain a digital value of the speaker voltage $V_{SPK}$ in order to calculate the impedance of the speaker 104 in the digital domain as a linear function of the digital input signal 111 value. However, because the speaker voltage $V_{SPK}$ is ultra-low, e.g., inaudible, it may be difficult to design an audio ADC that can convert the ultra-low speaker voltage $V_{SPK}$ to a digital value with the precision needed to detect the slight changes in the impedance of the speaker 104 caused, for example, by environmental conditions. Therefore, a low noise amplifier 106 is employed to amplify the speaker voltage $V_{SPK}$ to an amplified voltage $V_{AMP}$. In one embodiment, the noise added by the low noise amplifier 106 (modeled at the input to the amplifier 106) is approximately less than 250 nano-Volts. Aspects of embodiments of the low noise amplifier 106 are described below with respect to FIGS. 3 through 7. The gain G of the low noise amplifier 106 is also known.

The audio ADC 108 converts the amplified voltage $V_{AMP}$ to a digital audio output signal 113 that is provided to the DSP 112 that uses the measured amplified voltage $V_{AMP}$, along with the known values of the digital input signal 111, the attenuating resistors $R_{ATT}$ and the gain G of the low noise amplifier 106, to calculate the impedance of the speaker 104. In one embodiment, the impedance of the speaker 104 is calculated according to equation (1), $$R_{SPK} = \left(\frac{2 * R_{ATT}}{G}\right) * (D_{AUDIO-OUT} / D_{AUDIO-IN}) \qquad (1)$$

where $R_{SPK}$ is the impedance of the speaker 104, $D_{AUDIO-OUT}$ is the measured value of the digital output signal 113, $D_{AUDIO-IN}$ is the known value of the digital input signal 111, $R_{ATT}$ is the known value of an attenuating resistor $R_{ATT}$, and G is the known gain of the low noise amplifier 106. Equation (1) provides a high degree of accuracy with the assumption that the value of the attenuating resistors $R_{ATT}$ is much larger than the impedance of the speaker 104, as described above. Given that $R_{ATT}$, G and $D_{AUDIO-IN}$ are all known, or controlled, quantities, equation (1) may be simplified as equation (2)

$$R_{SPK} = K * D_{AUDIO-OUT} \qquad (2)$$

where K is a known constant of proportionality.

As shown in FIG. 1, the entire signal path from the output of the DAC 102 to the input of the ADC 108 is a differential signal path. More specifically, the speaker voltage $V_{SPK}$ is maintained as respective positive and negative voltage signals $V_{SPK\_P}$ and $V_{SPK\_M}$, and the amplified voltage $V_{AMP}$ is maintained as respective positive and negative voltage signals $V_{AMP\_P}$ and $V_{AMP\_M}$. The fully differential signal path may advantageously achieve good common mode rejection.

Figure 2:
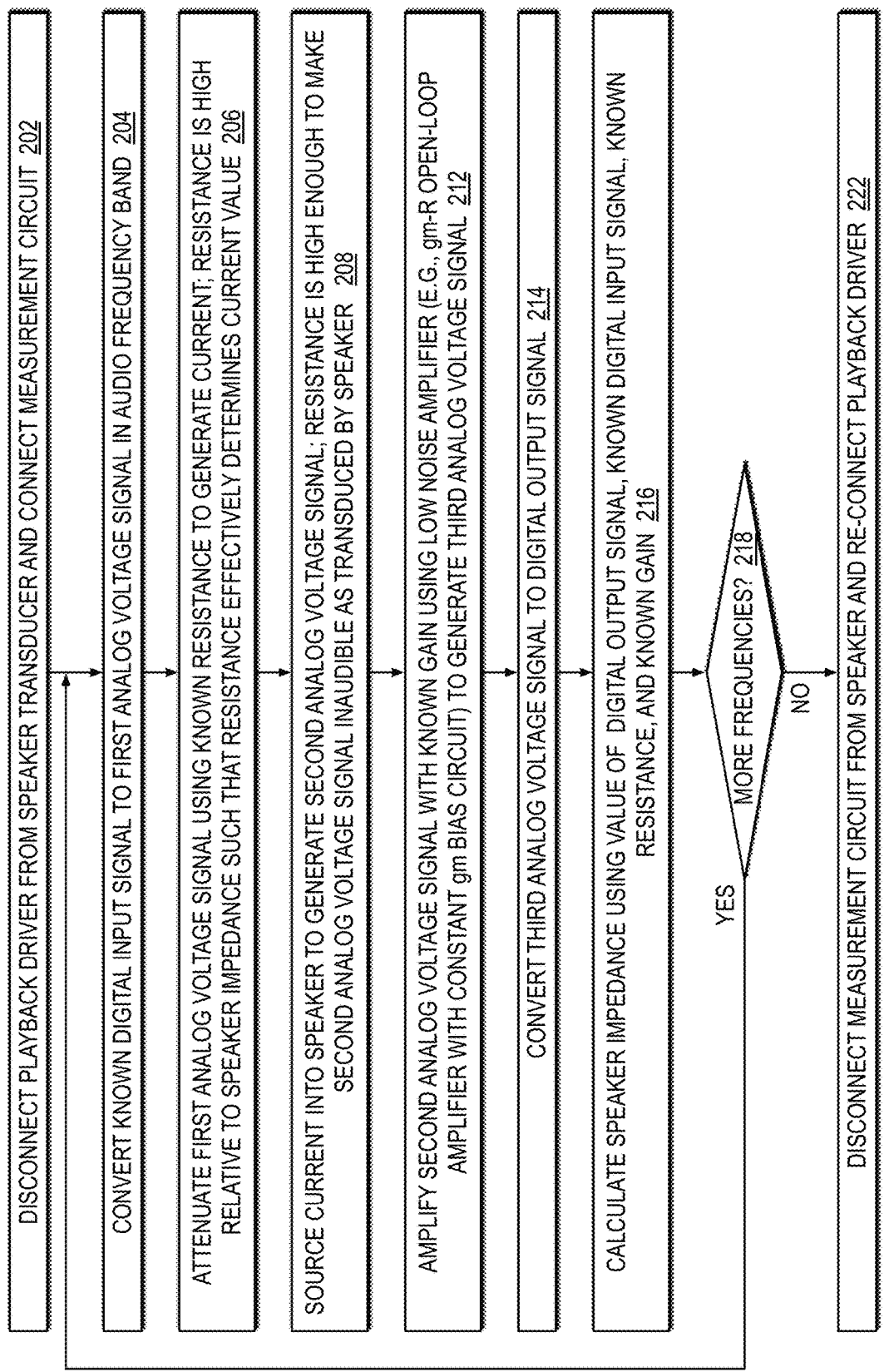
FIG. 2 is an example of a flowchart illustrating operation of the system of FIG. 1 in accordance with embodiments of the present disclosure.

FIG. 2 is an example of a flowchart illustrating operation of the system 100 of FIG. 1 in accordance with embodiments of the present disclosure. The operation begins at block 202.

At block 202, it is determined that the impedance of the speaker 104 needs to be measured, so the speaker driver is disconnected from the speaker 104 (e.g., connecting circuitry of the speaker driver is placed into a high impedance state) and the measuring apparatus 101 is connected to the speaker 104. The operation proceeds to block 204.

At block 204, a known digital input signal (e.g., digital input signal 111 of FIG. 1) is converted (e.g., by DAC 102) to a first analog audio voltage signal (e.g., voltage $V_{DAC}$). Preferably, the first analog audio voltage signal is at a single audio frequency. The operation proceeds to block 206.

At block 206, the first analog signal is attenuated using a known resistance (e.g., attenuating resistors $R_{ATT}$) to generate a current (e.g., load current $I_{LOAD}$). As described above, the value of the known resistance is much larger than the impedance of the speaker 104 such that the known resistance effectively determines the value of the current, independent of fluctuations in the impedance of the speaker 104. The operation proceeds to block 208.

At block 208, the current is forced into the speaker 104 to generate a second analog voltage signal (e.g., speaker voltage $V_{SPK}$). As described above, the value of the known resistance is sufficiently large to make the second analog voltage signal sufficiently small such that it is inaudible when transduced by the speaker 104. The operation proceeds to block 212.

At block 212, the second analog voltage signal is amplified by a known gain with a low amount of noise introduced (e.g., by the low noise amplifier 106 with known gain G) to generate a third analog voltage signal (e.g., amplified voltage $V_{AMP}$). In one embodiment, the amount of noise introduced by the amplification is less than approximately 250 nano-Volts. In one embodiment, the signal-to-noise ratio of the amplified voltage $V_{AMP}$ is approximately 46 dB. The operation proceeds to block 214.

At block 214, the third analog voltage signal is converted (e.g., by ADC 108) to a digital output signal (e.g., digital audio output signal 113). The operation proceeds to block 216.

At block 216, the impedance of the speaker 104 is calculated (e.g., by DSP 112) using the value of the digital output signal measured at block 214, the known digital input signal converted at block 204, the known resistance used to attenuate at block 206, and the known gain used to amplify at block 212, e.g., according to equation (1) above. The measured impedance is also recorded for subsequent analysis. The operation proceeds to block 218.

At decision block 218, if there are more audio frequencies at which to measure the impedance of the speaker 104, operation returns to block 204 so that another instance of the operations at blocks 204 through 216 may be performed at the next audio frequency; otherwise, operation proceeds to block 222.

At block 222, the measurement apparatus 101 is disconnected from the speaker 104 and the playback driver is re-connected so that the speaker 104 may be used for normal operations.

Figure 3:
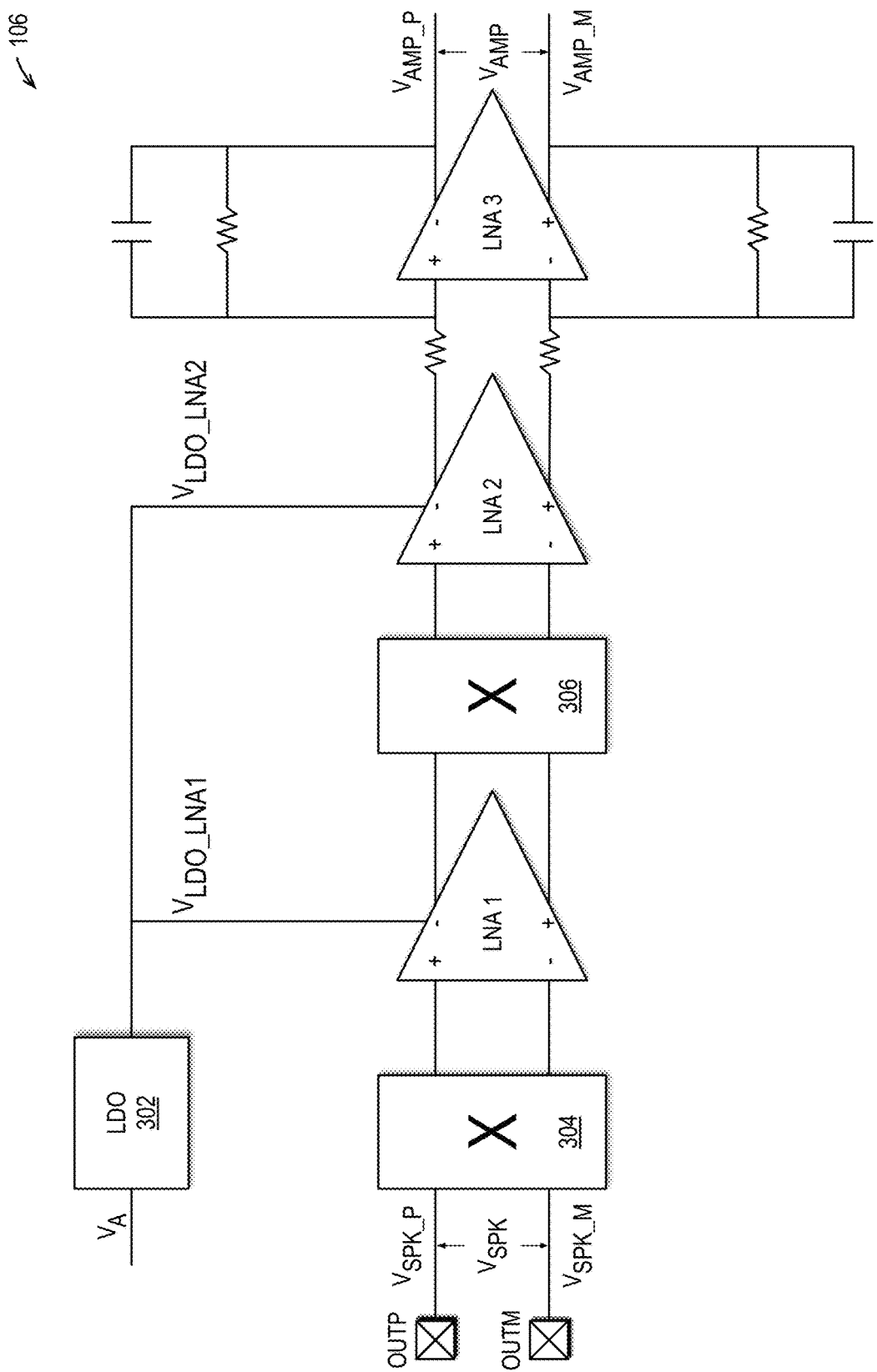
FIG. 3 is an example of a low noise amplifier (e.g., low noise amplifier of FIG. 1) with high power supply rejection ratio (PSRR) and input common mode rejection ratio (CMRR) in accordance with embodiments of the present disclosure.

FIG. 3 is an example of a low noise amplifier (e.g., low noise amplifier 106 of FIG. 1) with high power supply rejection ratio (PSRR) and input common mode rejection ratio (CMRR) in accordance with embodiments of the present disclosure. The low noise amplifier 106 includes a first chopping switch 304, a first low noise fully differential amplifier open-loop LNA1, a second chopping switch 306, a second low noise fully differential open-loop amplifier LNA2, a third low noise fully differential closed-loop amplifier LNA3, and a low dropout regulator (LDO) 302. The LDO 302 regulates a supply voltage $V_A$ to generate a first regulated supply voltage $V_{LDO\_LNA1}$ provided to LNA1 and a second regulated supply voltage $V_{LDO\_LNA2}$ provided to LNA2. The LDO 302 reduces noise from the power supply so that the low noise amplifier 106 has low noise biasing voltages in order to increase the measurement accuracy of the inaudible speaker voltage $V_{SPK}$. An embodiment of LDO 302 is described in detail with respect to FIG. 5.

The inputs of the first chopping switch 304 are connected to the OUTP and OUTM pins of FIG. 1 to sink inaudible speaker voltage $V_{SPK}$. In one embodiment, the first and second chopping switches 304 and 306 are crossbar switches that alternately pass their inputs through to their respective outputs or across to the opposite output at a chopping clock frequency (e.g., 400 kHz) according to an input clock signal to accomplish chopping to reduce noise, e.g., flicker noise. The chopped speaker voltage $V_{SPK}$ is provided by the first chopping switch 304 to LNA1 for amplification in a low noise manner using first regulated supply voltage $V_{LDO\_LNA1}$. In one embodiment, LNA1 amplifies the chopped speaker voltage $V_{SPK}$ by 20 dB. An embodiment of LNA1 is described in detail with respect to FIG. 4.

The inputs of the second chopping switch 306 are connected to the outputs of LNA1. The de-chopped output of LNA1 is provided by the second chopping switch 306 to LNA2 for amplification in a low noise manner using second regulated supply voltage $V_{LDO\_LNA2}$. In one embodiment, LNA2 amplifies the output of the second chopping switch 306 by 20 dB. The low noise amplifier 106 also includes an input resistor (e.g., 30 kilo-Ohm) connected between the output of LNA2 and the input of LNA3, a feedback resistor (e.g., 210 kilo-Ohm) across the input and output of LNA3, and a feedback capacitor (e.g., 2 pico-Farad) across the input and output of LNA3 in parallel with the feedback resistor. In one embodiment, LNA3 amplifies the output of LNA2 by 17 dB using the supply voltage $V_A$ to generate amplified voltage $V_{AMP}$.

Figure 4:
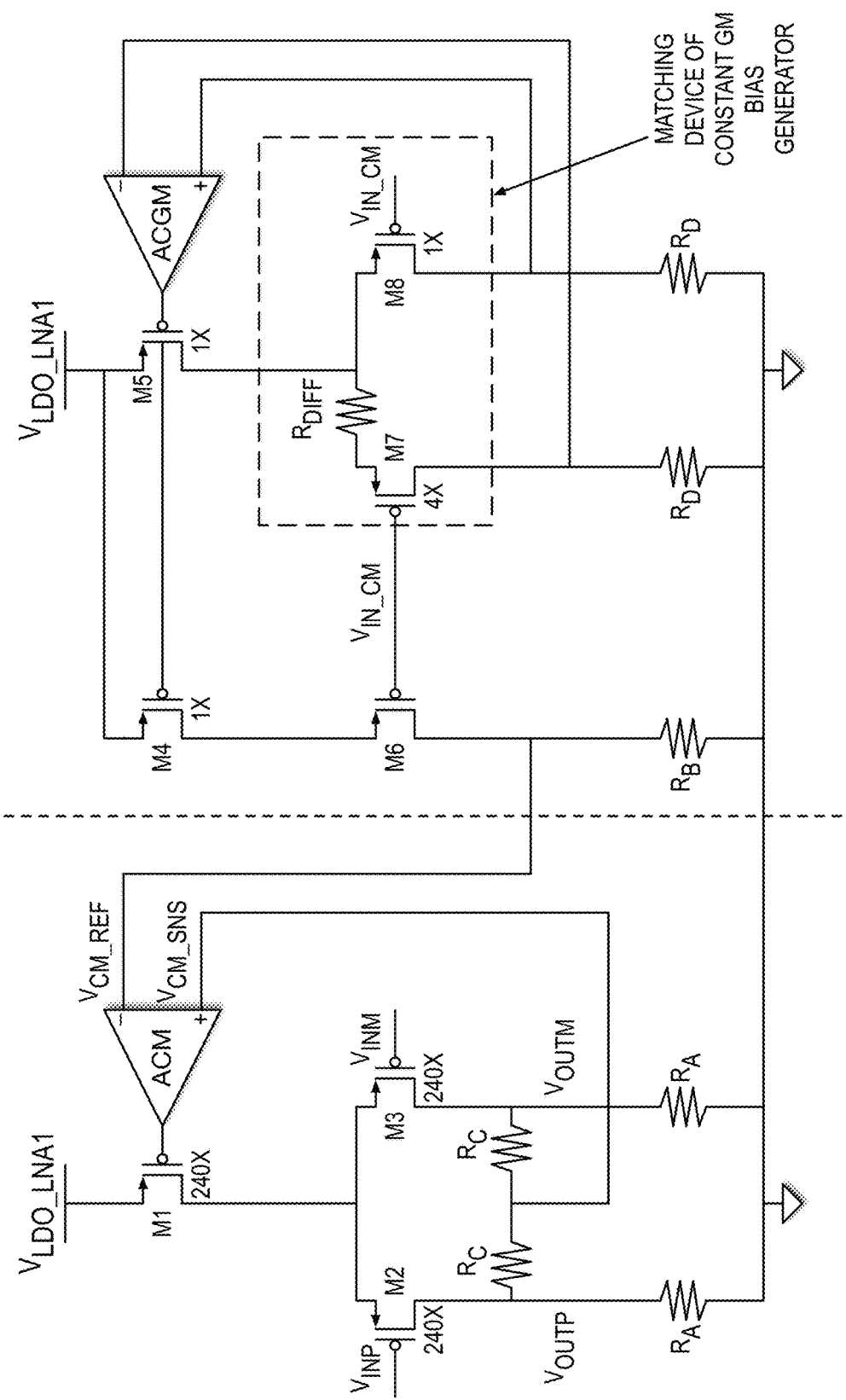
FIG. 4 is an example of the first stage of the low noise amplifier of FIG. 3 in accordance with embodiments of the present disclosure.

FIG. 4 is an example of the first stage LNA1 of the low noise amplifier 106 of FIG. 3 in accordance with embodiments of the present disclosure. LNA1 is shown on the left side of FIG. 4, and a constant gm bias circuit 400 is shown on the right side. In one embodiment, both LNA1 and the bias circuit 400 use the first regulated supply voltage $V_{LDO\_LNA1}$ (e.g., 1.4 Volt) from the LDO 302 of FIG. 5. The LNA1 includes three p-channel MOSFET transistors, M1 through M3, and the bias circuit 400 includes five p-channel MOSFET transistors M4 through M8.

Transistors M2 and M3 are a differential input pair that have their sources connected to form a first transconductor (e.g., 75 milli-Siemens). The gate of M2 is connected to the positive side voltage $V_{INP}$ of the output of the first chopping switch 304 of FIG. 3 and the gate of M3 is connected to the negative side voltage $V_{INM}$ of the output of the first chopping switch 304. The drain of M2 is connected at a node $V_{OUTP}$ to one side of a first resistor attenuator $R_A$ (e.g., 150 Ohm, not to be confused with attenuating resistor $R_{ATT}$ of FIG. 1) which is connected to ground on its other side, and the drain of M3 is connected at a node $V_{OUTM}$ on one side to a second resistor attenuator $R_A$ which is connected to ground on its other side. In one embodiment, the tail current through each resistor attenuator $R_A$ is approximately 5 milli-Amps. The resistors $R_A$ operating as attenuators advantageously enable LNA1 to add only a small amount of noise to the amplified signal. The nodes $V_{OUTP}$ and $V_{OUTM}$ are the output of LNA1 which is connected to the input the second chopping switch 306 of FIG. 3. Node $V_{OUTP}$ is also connected to a first resistor $R_C$ that is connected on its other side to a node $V_{CM\_SNS}$ that is connected to the non-inverting input of an operational amplifier (op amp) ACM. Node $V_{OUTM}$ is also connected to a second resistor $R_C$ that is connected on its other side to node $V_{CM\_SNS}$. Transistor M1 is connected with its gate to the output of op amp ACM, its source to regulated supply voltage $V_{LDO\_LNA1}$, and its drain to the sources of transistors M2 and M3. The inverting input of op amp ACM is connected to a node $V_{CM\_REF}$ that is connected to the bias circuit 400.

A resistor $R_{DIFF}$ is connected between the sources of transistors M7 and M8, which form a second transconductor. The gates of M7 and M8 are connected to a common mode input voltage $V_{IN\_CM}$. The drain of M7 is connected to one side a first resistor $R_D$ (e.g., 20 kilo-Ohm) which is connected to ground on its other side, and the drain of M8 is connected on one side to a second resistor $R_D$ which is connected to ground on its other side. In one embodiment, the tail current through each resistor $R_D$ is approximately 20 micro-Amps. Transistor M5 is connected with its gate to the output of a second op amp ACGM, its source to first regulated supply voltage $V_{LDO\_LNA1}$, and its drain to the right side of resistor $R_{DIFF}$ and to the source of transistor M8. The inverting input of op amp ACGM is connected to the drain of M7 and the non-inverting input is connected to the drain of M8.

The gate of transistor M4 is connected to the output of op amp ACGM. The source of transistor M4 is connected to first regulated supply voltage $V_{LDO\_LNA1}$, and the drain of M4 is connected to the source of transistor M6. The gate of M6 is connected to the gate of M7 and to the common mode input voltage $V_{IN\_CM}$. The drain of M6 is connected to one side of a resistor $R_B$ whose other side is connected to ground. The drain of M6 is also connected to LNA1, more specifically to the inverting input of op amp ACM at node $V_{CM\_REF}$.

Advantageously, LNA1 includes the common mode feedback (CMFB) loop from the transconductor through op amp ACM. The continuous CMFB loop may advantageously increase tail current output impedance and improve PSRR, which may be important to accurately measure the impedance of the speaker 104 given the ultra-low inaudible speaker voltage $V_{SPK}$ input to LNA1. Furthermore, the constant gm bias circuit 400 provides the reference voltage $V_{CM\_REF}$ of the CMFB loop. Since LNA1 and LNA2 are open-loop amplifiers, the reference voltage $V_{CM\_REF}$ provided by the constant gm bias circuit 400 may be particularly advantageous for stabilizing the gain of the LNA1 and LNA2 over temperature variations, which is needed because the gain G of the low noise amplifier 106 needs to be known, e.g., per equation (1) above. In one embodiment, the LNA1 output common mode feedback loop has high bandwidth (e.g., approximately 7 MHz) and provides good supply noise rejection within the 20 kHz audio band. In one embodiment, the structure of LNA2 of FIG. 3 is similar in many respects to that of LNA1. LNA1 advantageously serves as a basis of the low noise amplifier 106, which is a low noise open-loop transconductance operational amplifier having a resistor attenuator (e.g., resistor $R_A$) and a constant gm bias circuit 400 that enables the inaudible speaker voltage $V_{SPK}$ signal to be amplified with low noise before being converted to a digital signal (e.g., digital audio output signal 113) by the audio ADC 108.

Figure 5:
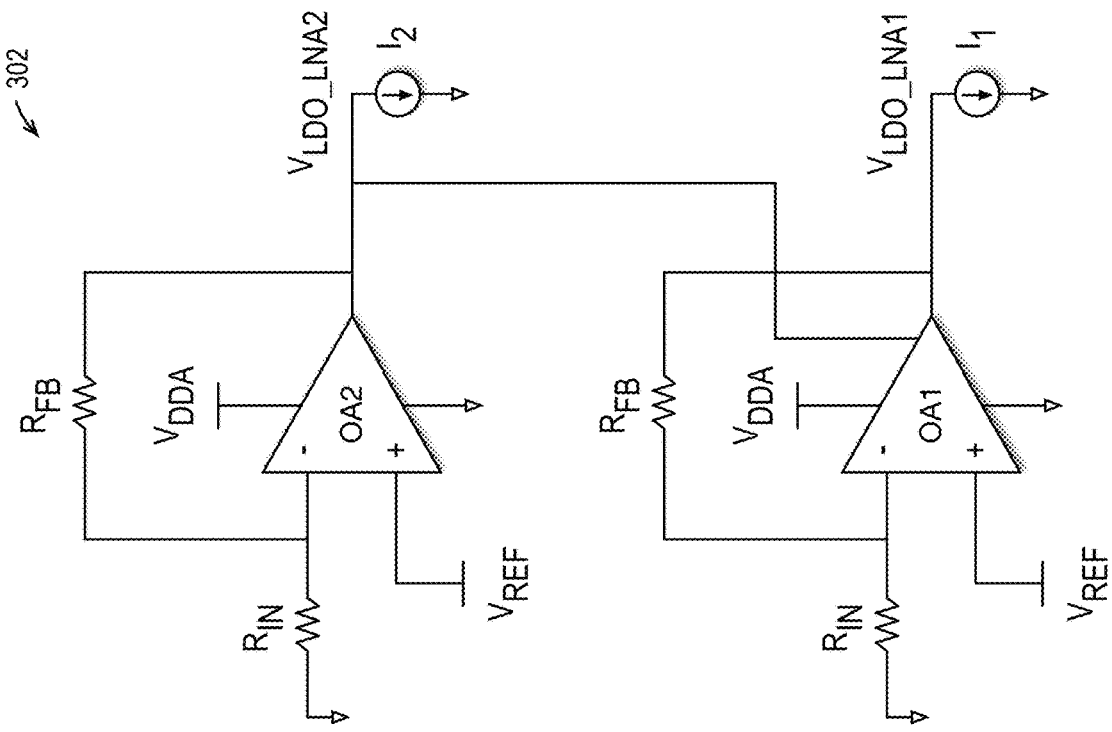
FIG. 5 is an example of a low dropout regulator in accordance with embodiments of the present disclosure.

FIG. 5 is an example of an LDO 302 in accordance with embodiments of the present disclosure. The LDO 302 includes first and second LDOs shown at the top and bottom, respectively, of FIG. 5. The top LDO includes an operational amplifier OA2 (e.g., 3-stage operational amplifier) that receives the supply voltage $V_A$ (e.g., 1.8V) and has its non-inverting input connected to a reference voltage $V_{REF}$ (e.g., 0.9V). The output of OA2 is connected to a ground-side current source 12 (e.g., 1 milli-Amp). OA2 has an input resistor $R_{IN}$ connecting its inverting input to ground and a feedback resistor $R_{FB}$. The top LDO regulates the supply voltage $V_A$ to the LNA2 regulated supply voltage $V_{LDO\_LNA2}$ (e.g., 1.5V) of FIG. 3, which drives the bottom LDO to provide very high PSRR, which may be important to accurately measure the impedance of the speaker 104 given the ultra-low inaudible speaker voltage $V_{SPK}$ input to LNA1.

The bottom LDO includes an operational amplifier OA1 (e.g., 3-stage operational amplifier) that receives the supply voltage $V_A$ and has its non-inverting input connected to the reference voltage $V_{REF}$. The output of OA1 is connected to a ground-side current source $I_1$ (e.g., 10 milli-Amp). OA1 has an input resistor $R_{IN}$ connecting its inverting input to ground and a feedback resistor $R_{FB}$. The bottom LDO regulates the supply voltage $V_A$ to the LNA1 regulated supply voltage $V_{LDO\_LNA1}$ (e.g., 1.4V) of FIG. 3. In one embodiment, each stage of the bottom LDO uses the $V_{LDO\_LNA2}$, except for the last stage which uses the supply voltage $V_A$. In one embodiment, the top LDO provides a 1.5V output with a 30 dB PSRR at 400 kHz, and the bottom LDO provides a 1.4V output with a 60 dB PSRR at 400 kHz.

Figure 6:
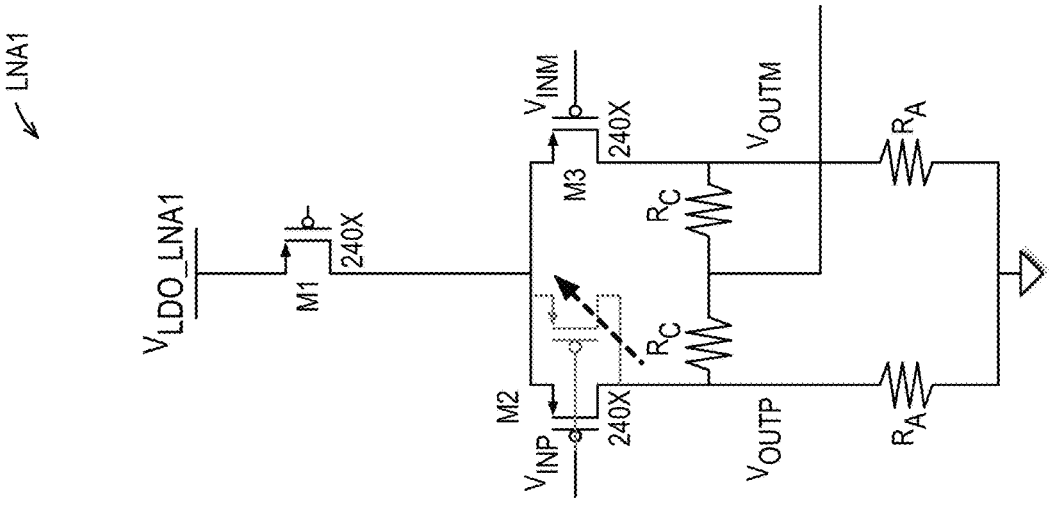
FIG. 6 is an example of calibration circuitry for calibrating the size of an input differential pair transconductor of the low noise amplifier of FIG. 4 in accordance with embodiments of the present disclosure.

FIG. 6 is an example of calibration circuitry for calibrating the size of an input differential pair transconductor of the LNA1 of FIG. 4 (or LNA2 of FIG. 3) in accordance with embodiments of the present disclosure. FIG. 6 shows portions of the LNA1 of FIG. 4. As shown, transistor M2 may be calibrated (e.g., by trimming its size) to remove output offset caused by threshold voltage mismatch, beta (amplification factor) mismatch and gds (drain to source transconductance) mismatch of the input differential pair M2 and M3. By calibrating the input differential pair, power supply noise current from the p-channel MOSFET tail may split more evenly and PSRR may be improved. In one embodiment, the calibration may be performed during production test and the calibration data may be stored in a one-time programmable (OTP) memory for subsequent retrieval and use. In one embodiment, the size of the input differential pair transconductor of the LNA1 (and LNA2, as well as the resistor attenuator per FIG. 7) are calibrated at each power up of the system 100.

Figure 7:
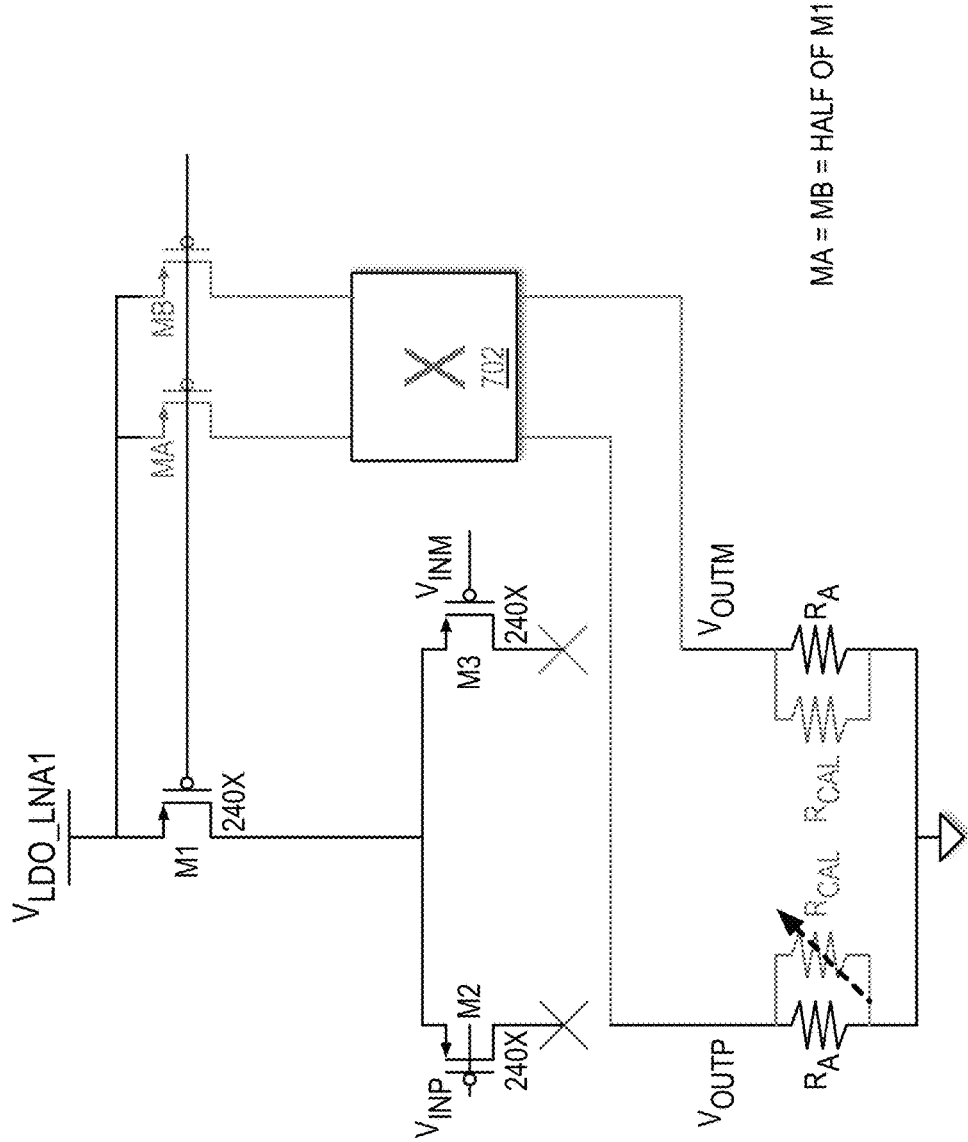
FIG. 7 is an example of calibration circuitry for calibrating the resistor attenuator of the low noise amplifier of FIG. 4 in accordance with embodiments of the present disclosure.

FIG. 7 is an example of calibration circuitry for calibrating the resistor attenuator $R_A$ of the LNA1 of FIG. 4 (or LNA2 of FIG. 3) in accordance with embodiments of the present disclosure. FIG. 7 shows portions of the LNA1 of FIG. 4. As shown, one or both of the resistor attenuators $R_A$ may be calibrated (e.g., by trimming) in order to match the resistance of the two resistor attenuators $R_A$. The calibration circuitry includes a chopping switch 702. One side of the output of the chopping switch 702 is connected to $V_{OUTP}$ and the other side is connected to $V_{OUTM}$. One side of the input of the chopping switch 702 is selectively connected to $V_{LDO\_LNA1}$ through a first p-channel MOSFET MA whose gate is connected to the op amp ACM (not shown, of FIG. 4), and the other side of the input of the chopping switch 702 is selectively connected to $V_{LDO\_LNA1}$ through a second p-channel MOSFET MB whose gate is connected to the op amp ACM. Preferably, transistors MA and MB are the same size, and each is half the size of transistor M1. The chopping switch 702 is operated at a chopping frequency according to a chopping clock input. To calibrate the resistors $R_A$, the input differential pair M2 and M3 of LNA1 is turned off. Then, two chopped currents are forced on the resistor attenuators $R_A$ through the chopping switch 702, and one or both of the resistor attenuators $R_A$ are trimmed until their resistances match. In one embodiment, the calibration may be performed during production test and the calibration data may be stored in a one-time programmable (OTP) memory for subsequent retrieval and use. Advantageously, the calibration of the resistor attenuators $R_A$ may further reduce error not eliminated by calibration of the differential input pair M2 and M3 as described above with respect to FIG. 6.

Figure 8:
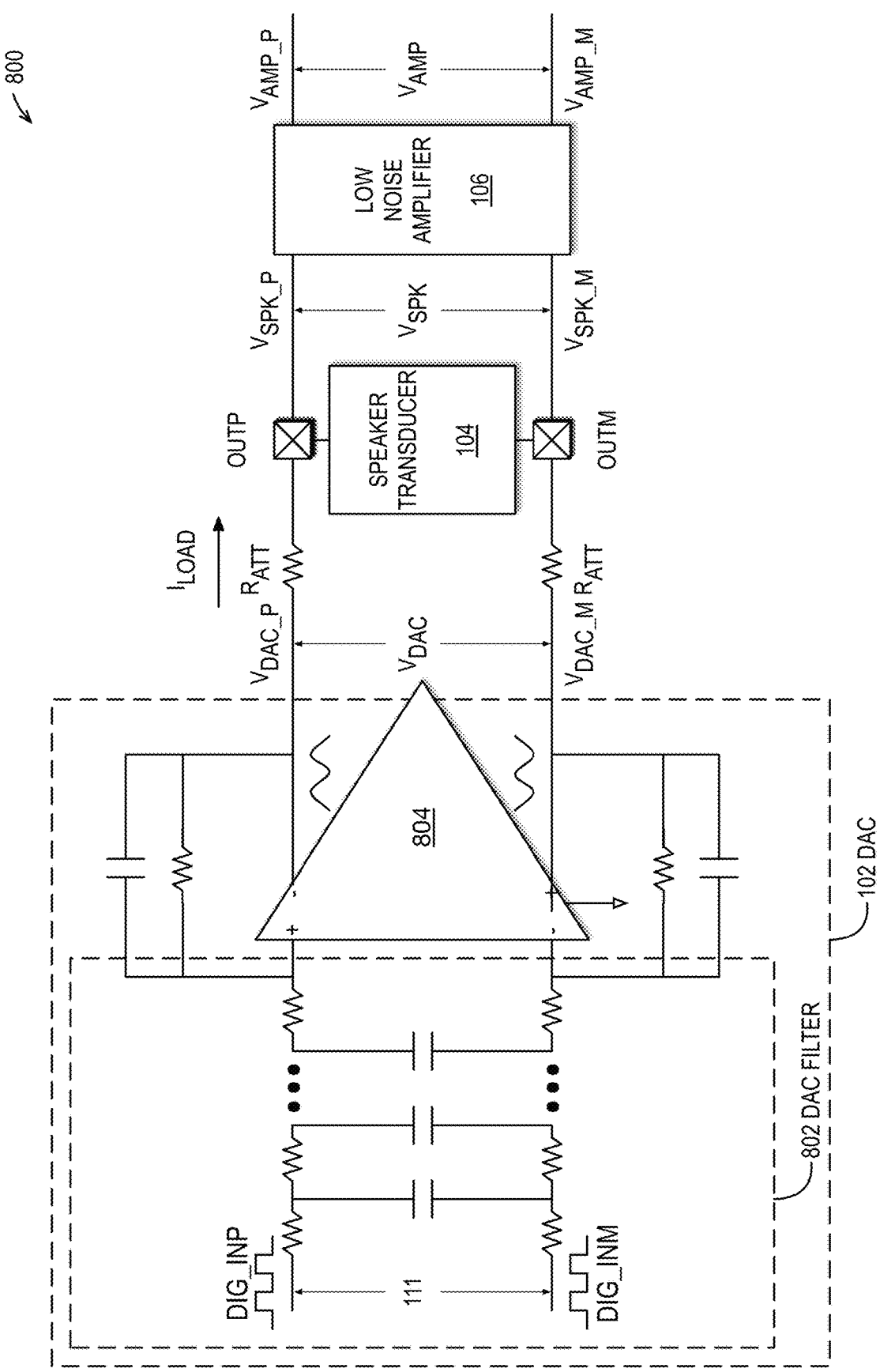
FIG. 8 is another example of a system that includes an apparatus for measuring a speaker transducer impedance as a function of frequency using an ultra-low inaudible signal in accordance with embodiments of the present disclosure.

FIG. 8 is another example of a system 800 that includes an apparatus for measuring a speaker transducer impedance as a function of frequency using an ultra-low inaudible signal in accordance with embodiments of the present disclosure. The system 800 is similar to the system 100 of FIG. 1 and includes most of the same elements as shown (the audio ADC 108 and DSP 112 of FIG. 1 are not shown). More specifically, an embodiment of the audio voltage DAC 102 of FIG. 1 with a passive filter 802 is shown. The passive filter 802 receives a differential digital input signal (DIG_INP and DIG_INM) and performs a steep roll off low pass filter function on the digital audio input signal 111 to advantageously filter out noise that is out of the audio frequency band. The passive DAC filter 802 includes an RC network having multiple resistors (e.g., 320 kilo-Ohm) in series connected between the positive side (DIG_INP) of the digital audio input signal 111 and the non-inverting input of an op amp 804 and multiple resistors in series connected between the negative side (DIG_INM) of the digital audio input signal 111 and the inverting input of the op amp 804. Capacitors (e.g., 4 pico-Farad) are connected between the differential rails between each of the series resistors. In one embodiment, the passive RC filter is a fifth order filter. A feedback resistor (e.g., 2 mega-Ohm) and feedback capacitor (e.g., 1 pico-Farad) in parallel are connected between the input and output of the op amp 804. The op amp 804 provides on its output analog voltage $V_{DAC}$. Advantageously, although the digital input signal 111 may be relatively noisy, the low amplitude analog voltage signal $V_{DAC}$ provided by the DAC 102 to the speaker transducer 104 for measurement of its impedance is very clean, i.e., very low noise, which may advantageously avoid ringing by the speaker transducer 104 which includes inductance.

Figure 9:
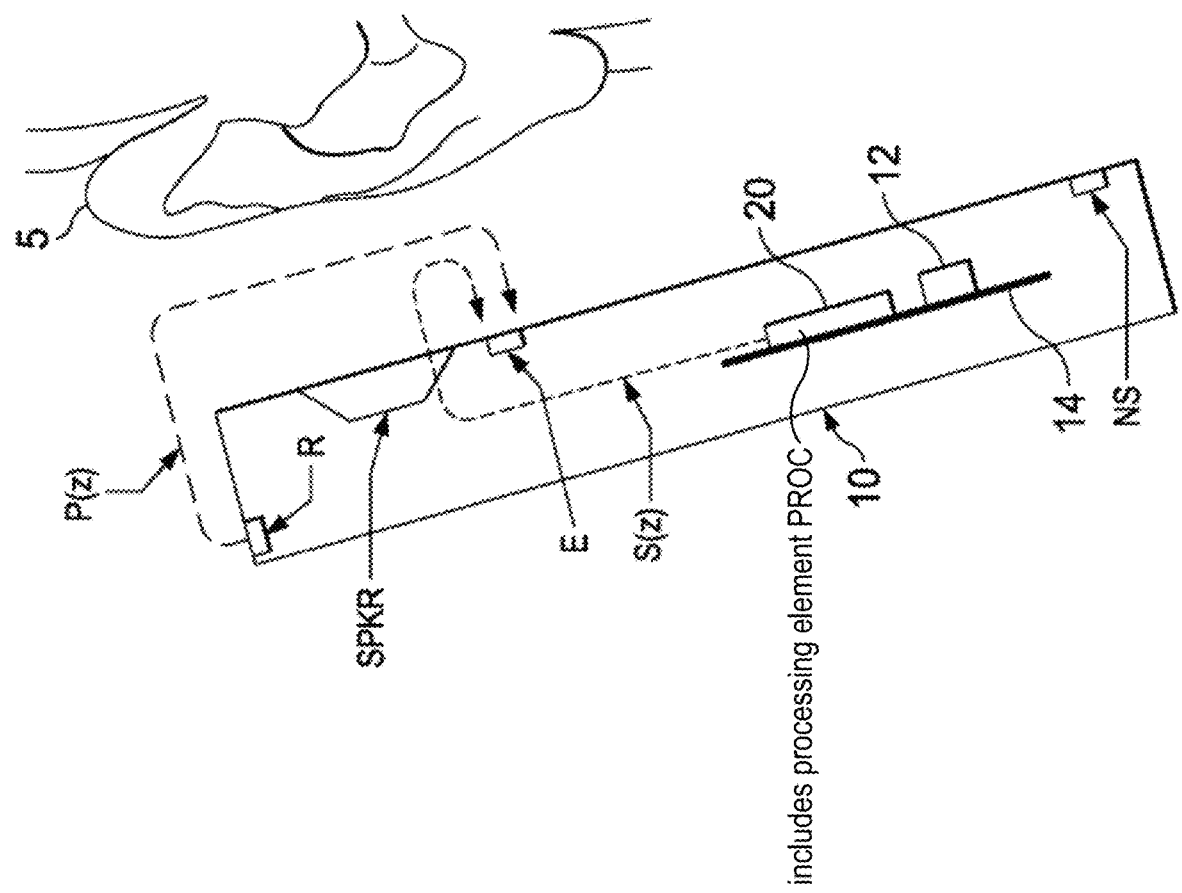
FIG. 9 is an example of a wireless telephone in accordance with embodiments of the present disclosure shown in proximity to a human ear.

FIG. 9 illustrates an example wireless telephone 10 in accordance with embodiments of the present disclosure shown in proximity to a human ear 5. Wireless telephone 10 is an example of a portable audio device which may include an apparatus and method (e.g., measuring apparatus 101) for measuring the impedance of a speaker transducer over an audio frequency spectrum with an inaudible amplitude signal in accordance with embodiments of this disclosure may be employed. Wireless telephone 10 may include a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. A near-speech microphone NS may be provided to capture near-end speech, which is transmitted from wireless telephone 10 to the other conversation participant(s). The impedance of speaker transducer SPKR may be measured over an audio frequency spectrum with an inaudible amplitude signal in accordance with embodiments of this disclosure.

Wireless telephone 10 may include active noise cancellation (ANC) circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when wireless telephone 10 is in close proximity to ear 5. Circuit 14 within wireless telephone 10 may include an audio CODEC integrated circuit (IC) 20 that receives the signals from reference microphone R, near-speech microphone NS, and error microphone E and interfaces with other integrated circuits such as a radio-frequency (RF) integrated circuit 12 having a wireless telephone transceiver. The IC 20 may include an apparatus and method for measuring the impedance of the speaker transducer SPKR over an audio frequency spectrum with an inaudible amplitude signal. In some embodiments of the disclosure, the circuits and techniques disclosed herein may be incorporated in a single integrated circuit that includes control circuits and other functionality for implementing the entirety of the portable audio device, such as an MP3 player-on-a-chip integrated circuit. In these and other embodiments, the circuits and techniques disclosed herein may be implemented partially or fully in software and/or firmware embodied in computer-readable media and executable by a controller or other processing device, such as processing element PROC of IC 20 that may perform operations for implementing an apparatus and method for measuring the impedance of the speaker transducer SPKR over an audio frequency spectrum with an inaudible amplitude signal as described herein. A processing element is an electronic circuit capable of fetching program instructions stored in addressed memory locations and executing the fetched instructions. IC 20 may also include a non-volatile memory.

Figure 10:
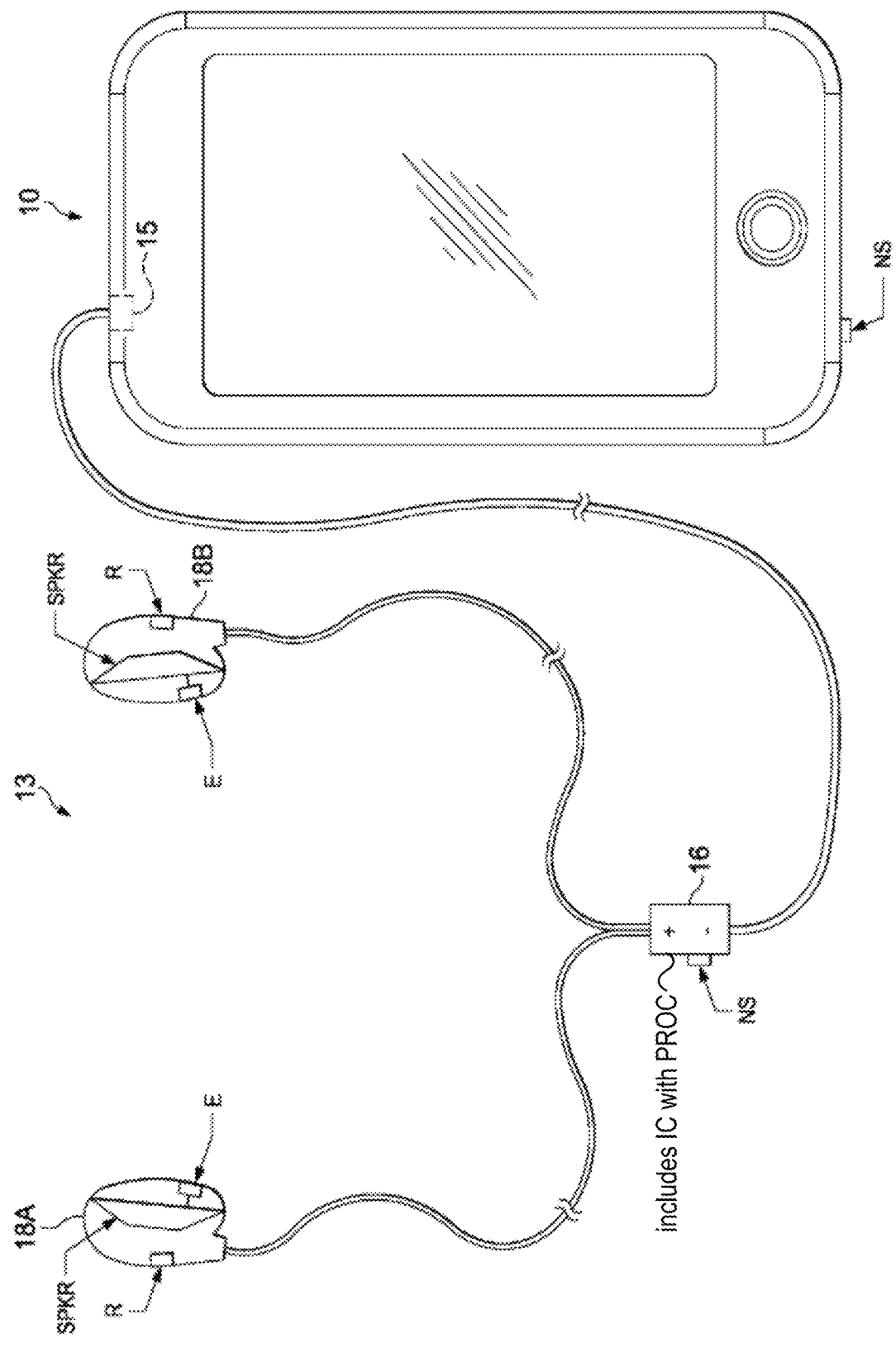
FIG. 10 is an example of a wireless telephone having a headset assembly coupled to it via audio port in accordance with embodiments of the present disclosure.

FIG. 10 depicts an example of a wireless telephone 10 having a headset assembly 13 coupled to it via audio port 15 in accordance with embodiments of the present disclosure. Audio port 15 may be communicatively coupled to RF integrated circuit 12 and/or CODEC IC 20, thus permitting communication between components of headset assembly 13 and one or more of RF integrated circuit 12 and/or CODEC IC 20 (e.g., of FIG. 9). In other embodiments, the headset assembly 13 may connect wirelessly to the wireless telephone 10, e.g., via Bluetooth or other short-range wireless technology. As shown in FIG. 10, headset assembly 13 may include a combox 16, a left headphone 18A, and a right headphone 18B. As used in this disclosure, the term "headset" broadly includes any loudspeaker and structure associated therewith that is intended to be mechanically held in place proximate to a listener's ear canal, and includes without limitation earphones, earbuds, and other similar devices. As more specific examples, "headset" may refer but is not limited to intra-concha earphones, supra-concha earphones, and supra-aural earphones.

Combox 16 or another portion of headset assembly 13 may have a near-speech microphone NS to capture near-end speech in addition to or in lieu of near-speech microphone NS of wireless telephone 10. In addition, each headphone 18A, 18B may include a transducer, such as speaker SPKR, that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. Each headphone 18A, 18B may include a reference microphone R for measuring the ambient acoustic environment and an error microphone E for measuring the ambient audio combined with the audio reproduced by speaker SPKR close to a listener's ear when such headphone 18A, 18B is engaged with the listener's ear. In some embodiments, CODEC IC 20 may perform operations for implementing an apparatus and method (e.g., measuring apparatus 101) for measuring the impedance of the speaker transducer SPKR over an audio frequency spectrum with an inaudible amplitude signal as described herein.

In other embodiments, headset assembly 13 is an example of a portable audio device in which techniques in accordance with embodiments of this disclosure may be employed. A CODEC IC having a processing element PROC and non-volatile memory similar to CODEC ID 20 of FIG. 9 or another circuit may be present within headset assembly 13, communicatively coupled to speaker transducer SPKR. Other embodiments are contemplated in which the audio device that includes an embodiment of the measuring apparatus 101 described herein is other than a phone or headset, such as an audio watch device or other device for which it would be advantageous to measure its speaker impedance in an inaudible fashion.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A method for measuring an impedance of a speaker, comprising:
    converting a known digital input signal to a first analog voltage signal in an audio frequency band;
    attenuating the first analog voltage signal using a known resistance to generate a current, wherein the known resistance is high relative to the speaker impedance so that the known resistance effectively determines the current;
    sourcing the current into the speaker to generate a second analog voltage signal, wherein the known resistance is sufficiently high to cause the second analog voltage signal to be inaudible as transduced by the speaker;
    amplifying the second analog voltage signal with a known gain to generate a third analog voltage signal;
    converting the third analog voltage signal to a digital output signal; and
    calculating the impedance of the speaker proportional to the digital output signal based on the known digital input signal, the known resistance, and the known gain.

2. The method of claim 1,
    wherein the first, second and third analog voltages are differential voltages.

3. The method of claim 1,
    wherein the third analog voltage signal generated by said amplifying has greater than 40 dB signal-to-noise ratio.

4. The method of claim 1,
    wherein an amount of noise introduced into the third analog voltage signal by said amplifying is no greater than approximately 300 nano-Volts.

5. The method of claim 1,
    wherein said amplifying the second analog voltage signal comprises amplifying the second analog voltage signal at least in part by an open-loop transconductance operational amplifier having matched resistor attenuators.

6. The method of claim 5,
    wherein the open-loop transconductance operational amplifier includes a continuous common mode feedback loop.

7. The method of claim 6,
    wherein the continuous common mode feedback loop receives a reference voltage from a constant transconductance amplifier.

8. The method of claim 5,
    wherein said amplifying the second analog voltage signal further comprises chopping the second analog voltage signal for input to the transconductance operational amplifier and chopping an output of the transconductance operational amplifier.

9. The method of claim 5, further comprising:
calibrating the resistor attenuators to improve their match.

10. The method of claim 5, further comprising:
calibrating input differential pair transistors of a transconductor of the open-loop transconductance operational amplifier.

11. The method of claim 5, further comprising:
supplying power to the open-loop transconductance operational amplifier via dual low dropout regulators.

12. The method of claim 1, further comprising:
performing a plurality of iterations of the operations of claim 1 for a corresponding plurality of different frequencies in the audio frequency band.

13. The method of claim 1, further comprising:
in a first mode for measuring the impedance of the speaker, using an analog-to-digital converter to perform said converting the known digital input signal to the first analog voltage signal; and
in a second mode for playing back audio through the speaker, using the ADC to measure an amplitude of an audible signal across the speaker for use in determining whether the speaker needs protection from the measured amplitude of the audible signal.

14. The method of claim 1,
wherein said converting the known digital input signal to the first analog voltage signal in the audio frequency band comprises passively filtering with steep roll off the digital input signal to reduce noise outside the audio frequency band.

15. An apparatus for measuring an impedance of a speaker, comprising:
a digital-to-analog converter that converts a known digital input signal to a first analog voltage signal in an audio frequency band;
resistors having a known resistance that attenuate the first analog voltage signal to generate a current, wherein the known resistance is high relative to the speaker impedance so that the known resistance effectively determines the current;
wherein the apparatus is operable to generate a second analog voltage signal when the current is sourced into the speaker, wherein the known resistance is sufficiently high to cause the second analog voltage signal to be inaudible as transduced by the speaker;
an amplifier that amplifies the second analog voltage signal with a known gain to generate a third analog voltage signal;
an analog-to-digital converter that converts the third analog voltage signal to a digital output signal; and
a processing element that calculates the impedance of the speaker proportional to the digital output signal based on the known digital input signal, the known resistance, and the known gain.

16. The apparatus of claim 15,
wherein the first, second and third analog voltages are differential voltages.

17. The apparatus of claim 15,
wherein the third analog voltage signal generated by the amplifier has greater than 40 dB signal-to-noise ratio.

18. The apparatus of claim 15,
wherein an amount of noise introduced into the third analog voltage signal by the amplifier is no greater than approximately 300 nano-Volts.

19. The apparatus of claim 15,
wherein the amplifier comprises an open-loop transconductance operational amplifier having matched resistor attenuators.

20. The apparatus of claim 19,
wherein the open-loop transconductance operational amplifier includes a continuous common mode feedback loop.

21. The apparatus of claim 20,
wherein the continuous common mode feedback loop receives a reference voltage from a constant transconductance amplifier.

22. The apparatus of claim 19, further comprises:
a chopping switch that chops the second analog voltage signal for input to the transconductance operational amplifier and a second chopping switch that chops an output of the transconductance operational amplifier.

23. The apparatus of claim 19, further comprising:
dual low dropout regulators that supply power to the open-loop transconductance operational amplifier.

24. The apparatus of claim 15,
wherein, in a first mode for measuring the impedance of the speaker, the analog-to-digital converter is usable to convert the known digital input signal to the first analog voltage signal; and
wherein, in a second mode for playing back audio through the speaker, the analog-to-digital converter is usable to measure an amplitude of an audible signal across the speaker to determine whether the speaker needs protection from the measured amplitude of the audible signal.

25. The apparatus of claim 15,
wherein the digital-to-analog converter comprises a passive steep roll off filter that filters the digital input signal to reduce noise outside the audio frequency band.

* * * * *